(12) United States Patent
Zheng et al.

(10) Patent No.: US 7,659,569 B2
(45) Date of Patent: Feb. 9, 2010

(54) WORK FUNCTION ENGINEERING FOR FN ERASE OF A MEMORY DEVICE WITH MULTIPLE CHARGE STORAGE ELEMENTS IN AN UNDERCUT REGION

(75) Inventors: Wei Zheng, Santa Clara, CA (US); Kuo-Tung Chang, Saratoga, CA (US); Sung-Yong Chung, Santa Clara, CA (US); Ashot Melik-Martirosian, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 72 days.

(21) Appl. No.: 11/953,690

(22) Filed: Dec. 10, 2007

(65) Prior Publication Data

US 2009/0146201 A1    Jun. 11, 2009

(51) Int. Cl.
*H01L 29/788* (2006.01)
*H01L 21/336* (2006.01)

(52) U.S. Cl. .............. 257/314; 257/216; 257/E21.409; 257/E29.3; 438/267; 438/257

(58) Field of Classification Search ......... 257/314–326, 257/E27.078, E29.3–29.309, E29.226, E21.409
See application file for complete search history.

(56) References Cited

U.S. PATENT DOCUMENTS

2004/0021172 A1*  2/2004  Zheng et al. ............... 257/316
2006/0281261 A1* 12/2006  Kim .......................... 438/264
2007/0040223 A1*  2/2007  Datta et al. ................. 257/368
2007/0178635 A1*  8/2007  Eldridge et al. ............ 438/201
2008/0061359 A1    3/2008  Lee et al.
2008/0237696 A1* 10/2008  Wang ........................ 257/324

OTHER PUBLICATIONS

Boron penetration in p+ polycrystalline-Si/Al2O3/Si metal-oxide-semiconductor system Dae-Gyu Park,a) Heung-Jae Cho, In-Seok Yeo, Jae-Sung Roh, and Jeong-Mo Hwang. Advanced Process Team, Memory Research and Development Division. Hyundal Electronics Industries Company Limited, Ichon P.O. Box 1010, Ichon-si, Kyoungki-do 467-701, Korea.*

\* cited by examiner

*Primary Examiner*—Fernando L Toledo
*Assistant Examiner*—Mamadou Diallo
(74) *Attorney, Agent, or Firm*—Turocy & Watson, LLP

(57) ABSTRACT

A memory device comprised of a plurality of memory cells that can each include multiple charge storage elements in undercut regions that are formed under a tunneling barrier and adjacent to a gate oxide layer of each memory cell. The tunneling barrier can be formed from a high work function material, such as P+ polycrystalline silicon or a P-type metal, and/or a high-K material. The memory cell can reduce the likelihood of gate electron injection through the gate electrode and into the charge storage elements during a Fowler-Nordheim erase by employing such tunneling barrier. Systems and methods of fabricating memory devices having at least one such memory cell are provided.

21 Claims, 15 Drawing Sheets

WORK FUNCTION ENGINEERING FOR FN ERASE OF A MEMORY DEVICE WITH MULTIPLE CHARGE STORAGE ELEMENTS IN AN UNDERCUT REGION

TECHNICAL FIELD

The subject disclosure relates to semiconductor devices, and more particularly, to non-volatile memory devices.

BACKGROUND

In a conventional charge trapping dielectric flash memory device, the charge storing regions can be part of a non-conductive charge trapping layer that can be disposed between a bottom (or tunnel) dielectric layer and a top dielectric layer. This dielectric stack can be formed over a P-type silicon substrate having a first and a second bit line disposed therein. A conductive word line that can be constructed from N type or N+ type polycrystalline silicon can be formed over the dielectric stack and serves as a gate electrode. The bit lines can be formed from N+ conductivity type material. Upon application of appropriate voltages to the word line and/or the bit lines, the bit lines can respectively function as a source and a drain with a channel region defined in between.

By the appropriate application of voltage potentials to the gate electrode, the source and/or the drain, each charge storing region can be programmed to store an amount of charge corresponding to a programmed, or charged, data state (as opposed to an unprogrammed, or blank, data state). Programming of the charge storage elements can involve channel hot electron (CHE) injection. In channel hot electron injection, electrons traveling within the channel that have a sufficient amount of energy to overcome the barrier height of the tunnel dielectric layer can become injected into the charge trapping layer where they can become trapped.

A conventional charge trapping dielectric memory device with an N+ polysilicon gate electrode usually can only be erased using the conventional technique of "hot hole injection", also referred to as band-to-band (BTB) hot hole injection. In hot hole injection, a gate voltage of approximately −4 to −8 volts can be applied along with a drain voltage on the order of 4.5 to 6.0 volts, while the source can be floated or grounded to erase one of the charge storing elements. Conversely, in order to erase the other charge storing element, the drain can be floated and appropriate voltages can be applied to the source and the gate electrode.

With such erase conditions, a BTB tunnel current can be created under the gate. Holes can be generated under these conditions and accelerate from the N-type drain region into the P-type body. The generated holes can be accelerated in the electrical field created near the P-N drain/body junction. Some of the holes can surmount the oxide to silicon interface between the substrate and the bottom oxide and can be injected into the nitride charge storing layer to displace electrons and erase the cell.

However, as the hot holes are created in the interface between the substrate and the bottom tunnel oxide, the interface and the bottom tunnel oxide can become damaged. Eventually, this damage can lead to data retention problems. As an example, degraded data retention reliability over program/erase cycling can occur due to stored charge leakage through the damaged tunnel oxide. As a result, a charge amount that has been "programmed" into one or both of the charge trapping regions can be reduced over time. In certain circumstances, enough charge can be lost that the data retention capability of the memory cell can be compromised.

Fowler-Nordheim erase (FN erase) can be used in floating gate devices (e.g., charge is stored in a conductive polysilicon layer rather than a dielectric layer). However, FN erase can be problematic for conventional memory cells. In particular, the vertical electric fields present during the erase can cause electrons to be pushed out from the charge storing layer to the substrate and/or cause electrons to flow from the N+ gate electrode through the top oxide and into the charge storing layer at approximately the same tunneling rate. Therefore, while there can be a net current from the gate electrode to the substrate, charge is not always erased effectively from the charge storing layer.

It is desirable to prevent the flow of electrons from the gate electrode to the charge storing layer during FN erase. It is also be desirable to lower the voltage level applied to effectuate an FN erase.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments of the invention in a simplified form as a prelude to the more detailed description of the various embodiments of the invention that follows.

The disclosed subject matter relates to systems and/or methods that facilitate forming a memory device (e.g., flash memory device) comprised of a plurality of multi-bit, multi level memory cells. In accordance with one aspect of the disclosed subject matter, a memory cell in a memory device can include at least two charge storage elements located in undercut regions formed under a tunneling barrier and adjacent to a gate oxide layer. In forming a memory cell, a tunneling barrier can be created utilizing a high work function material, such as P+ polycrystalline silicon or a P-type metal, as the gate electrode. As compared to conventional materials, such as an N+ type acting as the gate electrode, the high work function gate electrode can reduce the likelihood of an electron tunneling from a gate electrode of the memory cell through an oxide layer to the charge storage elements during Fowler-Nordheim erase (FN erase). As a result, erases of memory cells can be improved, as during an FN erase, the erase voltage to effectuate the FN erase can be reduced.

Conventionally, a memory cell can include one or more charge storage elements in an oxide/silicon rich nitride/polysilicon/silicon rich nitride/oxide (ORPRO) configuration. Each ORPRO configuration has layers of oxide, nitride, polysilicon, nitride, and/or oxide. Charge can be stored in the polysilicon and/or silicon rich nitride layer. In accordance with yet another aspect of the disclosed subject matter, memory cells can be formed with high-K material replacing the top oxide layer. By replacing the top oxide layer with high-K material, there can be a further reduction in the electron field during FN erase between the gate electrode and the charge storage element as compared to conventional memory devices.

In accordance with yet another aspect of the disclosed subject matter, the described memory cell can have a layer of high-K material replacing the top oxide layer as well as a high work function gate electrode.

In accordance with yet another aspect of the disclosed subject matter, the described memory cell can be fabricated by forming spaced stacks of gate silicon oxide on the surface of a semiconductor substrate. Two undercut regions can be formed in the gate silicon oxide, such as by wet etching. In each undercut region, at least one charge storage element can be formed. The described tunneling barrier can be part of the initial stack, such as P+ polycrystalline silicon overlying the gate silicon oxide on the stack, or formed subsequently by stripping one or more layers of the initial stack and depositing a layer(s) comprised of desired material(s) (e.g., P+ polycrystalline silicon over oxide or high-K material) to form the tunneling barrier. Bit and/or word lines can be created so that an array of the described memory cells can function as a memory system.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
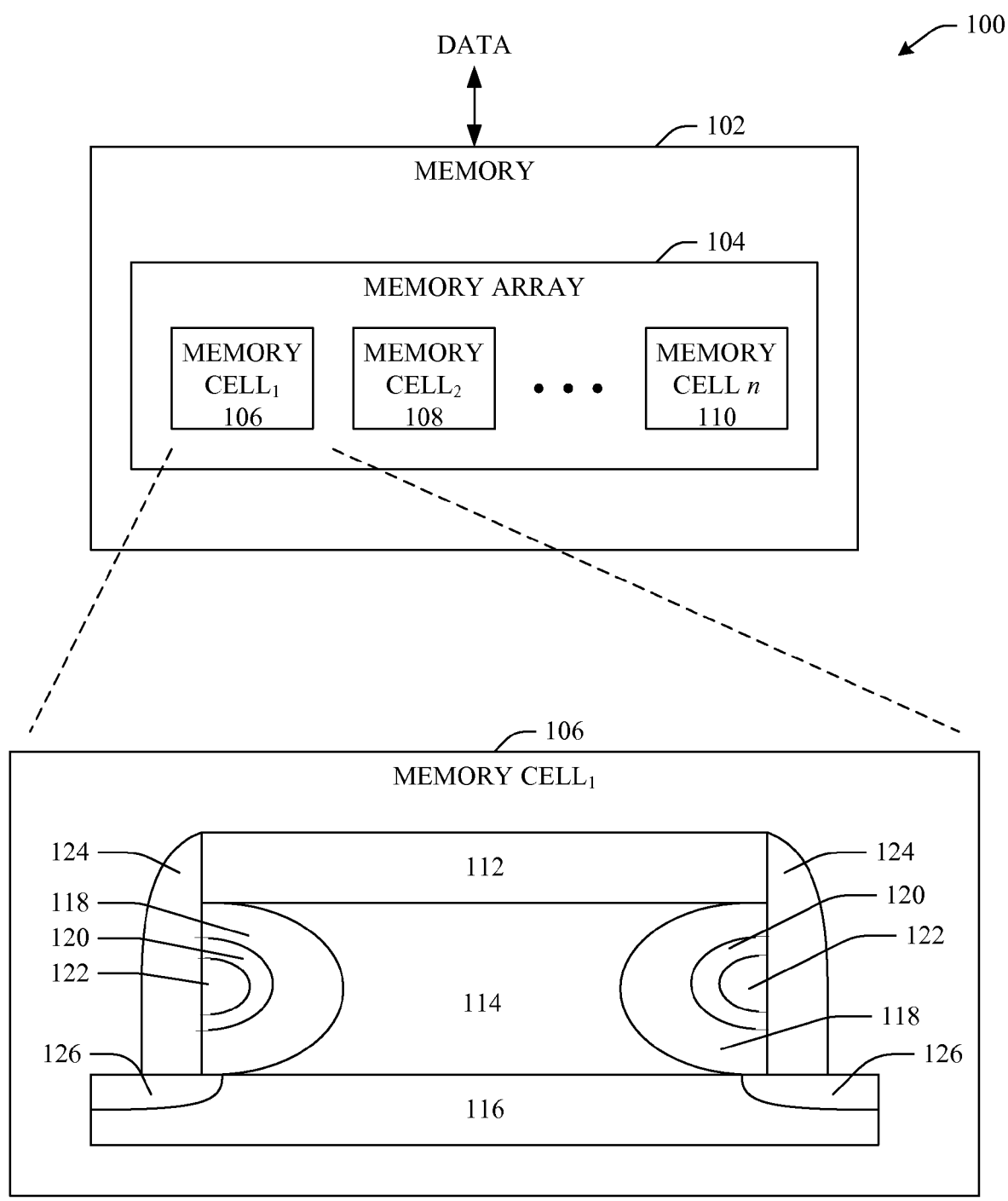
FIG. 1 illustrates a memory device according to one embodiment.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, a memory cell can include one or more charge storage elements in an oxide/silicon rich nitride/polysilicon/silicon rich nitride/oxide (ORPRO) configuration. Each ORPRO configuration has layers of oxide, silicon rich nitride, polysilicon, silicon rich nitride, and/or oxide. Charge can be stored in the polysilicon layer and/or silicon rich nitride layer. Each charge storage element can be erased using Fowler-Nordheim erase (FN erase). In particular, a voltage can be applied to the word line associated with that particular memory cell. When the voltage is being applied to erase a particular charge storage element, the performance of the erasing operation can also result in an undesirable flow of electrons, whereby electrons contained in a conduction band of the N+-type polysilicon gate undergo a Fowler-Nordheim (FN) tunneling such that the electrons can be injected into the conduction band of the charge storage element. This back tunneling is undesirable.

The subject matter disclosed herein facilitates reduction and/or elimination of back tunneling during an erase of a memory cell(s) by employing a tunneling barrier. The tunneling barrier can be a high work function material (e.g., P+ polycrystalline silicon, p-type metal) over a high-K material, such as aluminum oxide (e.g., $Al_2O_3$) or a Hafnium-based high-K material (e.g., $HfO_2$). In one embodiment, the erase speed of the memory device employing such high work function material and/or high-K material can be increased as compared to the erase speeds of conventional memory devices. The back tunneling reduction and/or elimination described herein can be applied to any suitable type of memory cell. For example, the erase process replacement and/or improvement described herein can be applied to single-level memory cells, multi-level memory cells, single-bit memory cells, multi-bit memory cells (e.g., dual-bit memory cells, quad-bit memory cells, etc.), and the like. The multi-bit memory cell is a relatively modern memory technology and allows multiple bits to be stored in a single memory cell.

Turning to the figures, FIG. 1 illustrates a cross-section of an exemplary, non-limiting embodiment of a memory device 100. One will appreciate that for the sake of readability, the cross-sectional views are not drawn to scale and that the various layers in the undercut regions can be formed in shapes other than a semicircle, such as in more of a rectangular or elliptical shape, for example.

The memory device 100 can include a memory 102, which can be a non-volatile memory (e.g., flash memory), that can include a memory array(s) 104 that can be comprised of a plurality of memory cells, depicted herein as memory cell$_1$ 106, memory cell$_2$ 108 and memory cell$_n$ 110. The memory 102 can receive data where, each memory cell 106 through 110 can store one or more bits of data therein, for example, as part of a program operation. The memory 102 can also provide data stored therein as an output, for example, as part of a read operation. Data can also be erased from the memory cells, for example, as part of an erase operation, where the erase can be effectuated using an erase technique, such as FN erase.

Each memory cell can be formed as a stack that can be comprised of a P+ polycrystalline silicon layer 112 overlying a gate oxide layer 114 that can be formed over a semiconductor substrate 116 and have one or more charge storage elements in each undercut region. In other embodiments, the P+ polycrystalline silicon can be replaced with other material(s) with a high work function, such as a p-type metal. The illustrated charge storage element can include a tunnel oxide layer 118, a silicon rich nitride layer 120, and/or the charge trapping layer 122. The charge trapping layer 122 can be made of polycrystalline silicon and can be surrounded by silicon rich nitride 120. One will appreciate that other materials, such as other nitrides or combination of nitride and silicon rich nitride, can alternatively be used. Overlaying the silicon rich nitride layer 120 in the illustration can be a tunnel oxide layer 118. Sidewall spacers 124 can be formed around the periphery of the P+ polycrystalline silicon layer 112 and silicon oxide (not shown) can be filled in between the sidewall spacers. Bit lines 126 can act as a source/drain depending on the operation (e.g., read, programming) being performed and the charge storage element upon which the operation is being performed.

Employing a high function work material, such as a P+ polycrystalline silicon or p-type metal, in layer 112 in place of a conventional material, such as N+-type polysilicon, can result in an improved erase of the memory cells, as there can be an increase in the erase speed, a reduction in the gate injection during an FN erase, and/or a lower erase saturation level, which can result in a larger program/erase window.

Figure 2:
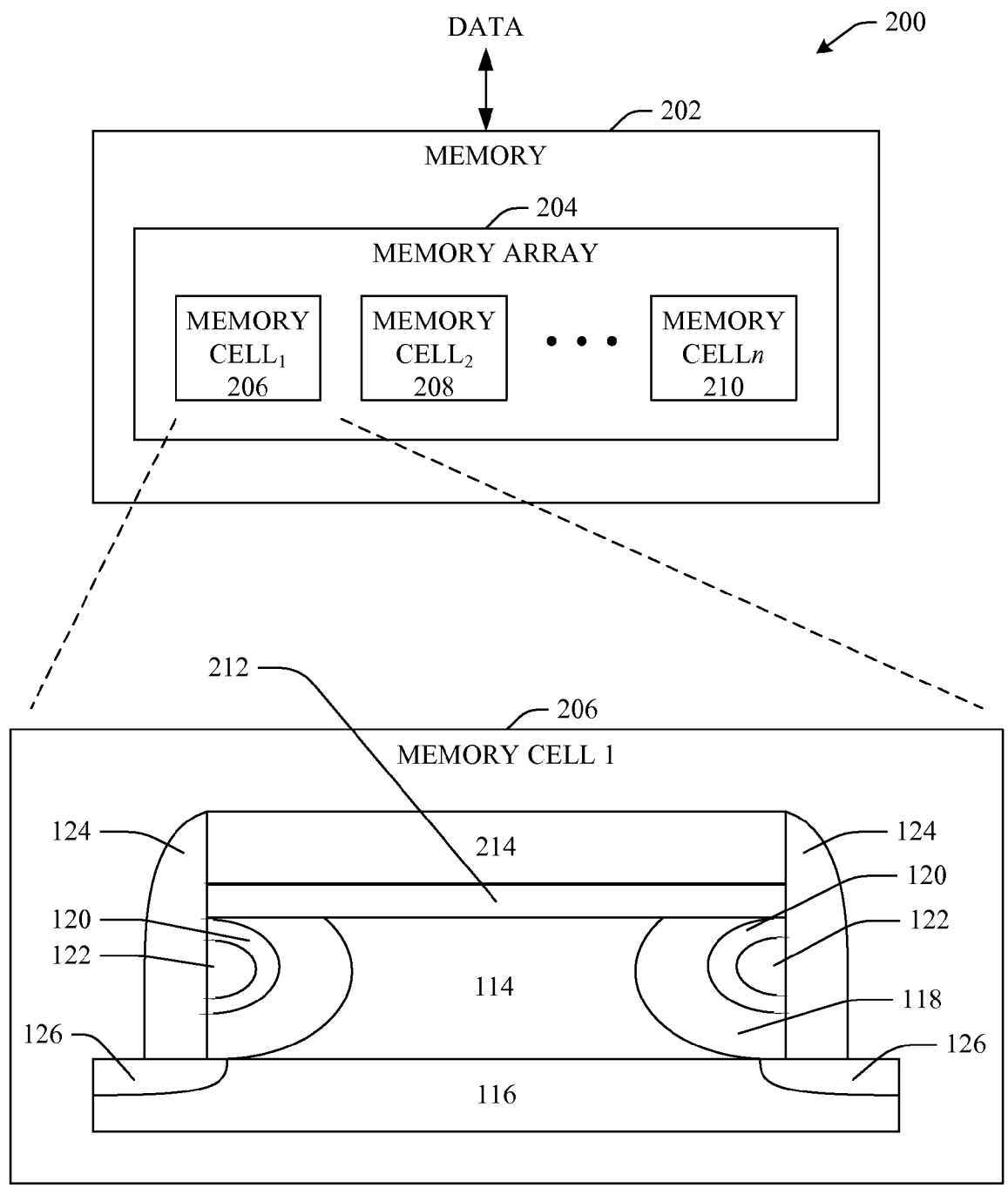
FIG. 2 illustrates a memory device according to another embodiment.

FIG. 2 illustrates yet another memory device 200 embodiment. Memory device 200 can include a memory 202, which can be a non-volatile memory (e.g., flash memory), that can include a memory array(s) 204 that can be comprised of a plurality of memory cells, illustrated herein as memory cell$_1$ 206, memory cell$_2$ 208 and memory cell$_n$ 210. The memory 102 can receive data, store data, and/or provide data. For example, during a program operation, data can be received by the memory 202 and stored in one or more memory cells (e.g., memory cell 206), where each memory cell can store one or more bits of data therein. As another example, during a read operation, the memory 202 can provide stored data stored as an output. Data can also be erased from the memory cells, for example, as part of an erase operation, where the erase can be effectuated using an erase technique, such as FN erase.

This embodiment of memory device 200 can contain other components similar to the memory device 100 in FIG. 1, except that each memory cell (e.g., 206 through 210) in memory array 204 can be comprised of a high-K material 212 instead of the top tunnel oxide layer (e.g., top portion of layer 118). As an oxide material can have a dielectric constant of approximately 3.9, a suitable high-K material, which can include, for example, those materials with a dielectric constant greater than approximately 3.9, can include, but is not limited to, aluminum oxide (e.g., $Al_2O_3$) or a hafnium-based material (e.g., $HfO_2$). The high-K material can be employed below gate electrode 214. The gate electrode 214 can be a high work function material, such as P+ polycrystalline silicon or a p-type metal, or can be a conventional N+ polycrystalline silicon layer. Replacing the top portion of the tunnel oxide layer 118 with a high-K layer 212 can result in an improved erased speed, a reduction in gate injection during an FN erase, and/or a lower erase saturation level.

Referring to FIGS. 3A-3G, the creation of a memory cell of a memory device according to one embodiment is illustrated using cross-sectional views during various phases of formation. In one embodiment, the memory cell (e.g., 106) can be comprised of a P+ polycrystalline silicon layer 214. In accordance with another embodiment, layer 214 can be comprised of another type of high function work material, such as a p-type metal, for example. The formation of the memory cell is but one form for creation of the memory cell, and it is to be appreciated that the memory cell can be created in other manners. For example, a stack can initially comprise a conventional N+ polycrystalline silicon layer, which can be stripped away and replaced via a gate replacement process to contain a layer comprised of P+ polycrystalline silicon or a p-type metal.

Figure 3A:
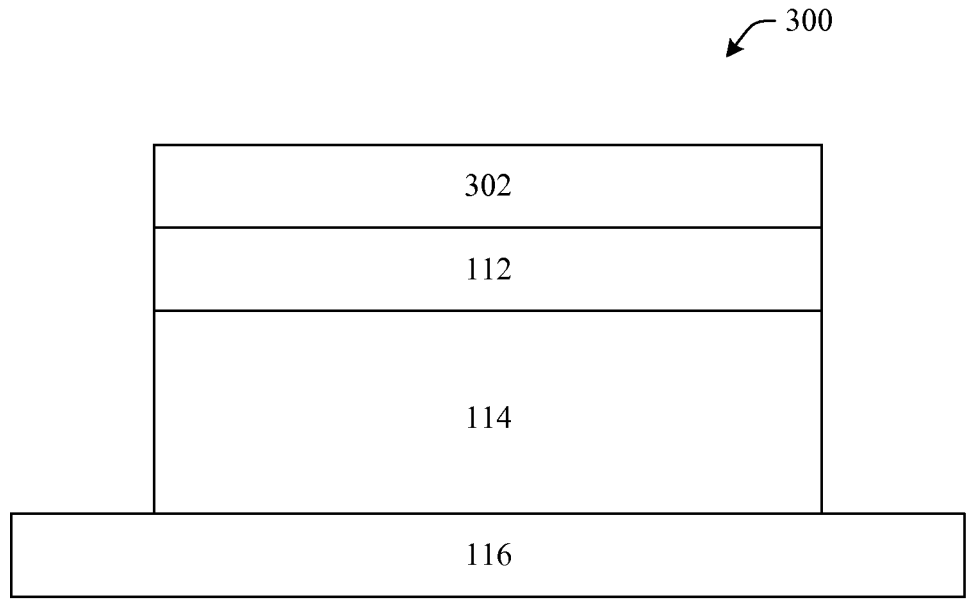
FIGS. 3A-3G illustrate the creation of a memory cell using cross-sectional views during various phases of formation according to one embodiment.

Referring to FIG. 3A, a cross-sectional view of a stack 300 used in fabricating the memory cell in a memory device is illustrated. In particular, a stack 300 comprises an overlying gate oxide layer 114, P+ polycrystalline silicon layer 112, and a hard mask 302 can be formed over substrate 116. The stack 300 can be positioned, for example, to expose surface areas for the fabrication of bit lines. It should be appreciated that the hard mask 302 can be made of various materials such as silicon nitride, for example. In one embodiment, the gate oxide layer 114 can have a thickness of approximately 20-500 angstroms and the P+ polycrystalline silicon layer 112 can have a thickness of range from approximately 200-2000 angstroms. Although other thicknesses can be utilized in accordance with other embodiments.

Figure 3B:
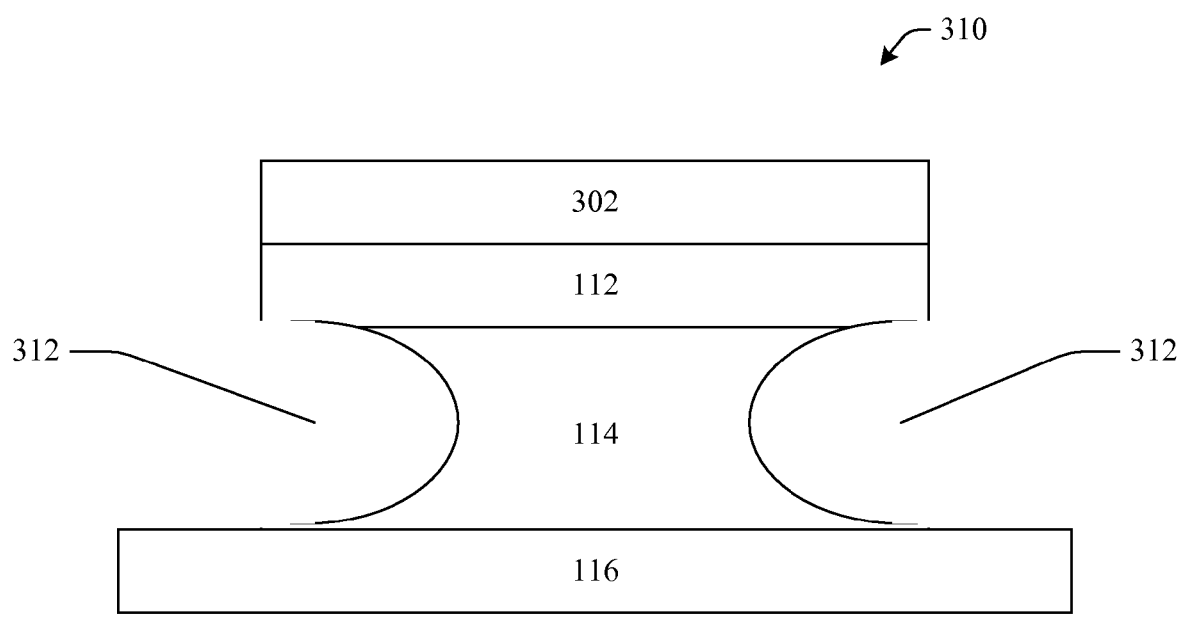

As shown in FIG. 3B, depicted is a stack 310 of a memory cell in a memory device, in accordance with an embodiment. The stack 310 can have two undercut regions 312. In order to form the two undercut regions 312, the gate oxide layer 114 can be selectively etched to form the two undercut regions 312 per memory cell on either side of the gate oxide layer 114 and under the P+ polycrystalline 112. For example, the selective etch can be performed by a wet etch, such as a diluted HF etch or a chemical oxide removal (COR) etch. In one embodiment, the widest widths (e.g., radius) of each undercut region 312 can be range from approximately 50-500 angstroms. One will appreciate that in other embodiments, the undercut region(s) 312 can leave a small layer of the initial gate silicon oxide on the top or bottom of the undercut region(s) 312.

Figure 3C:
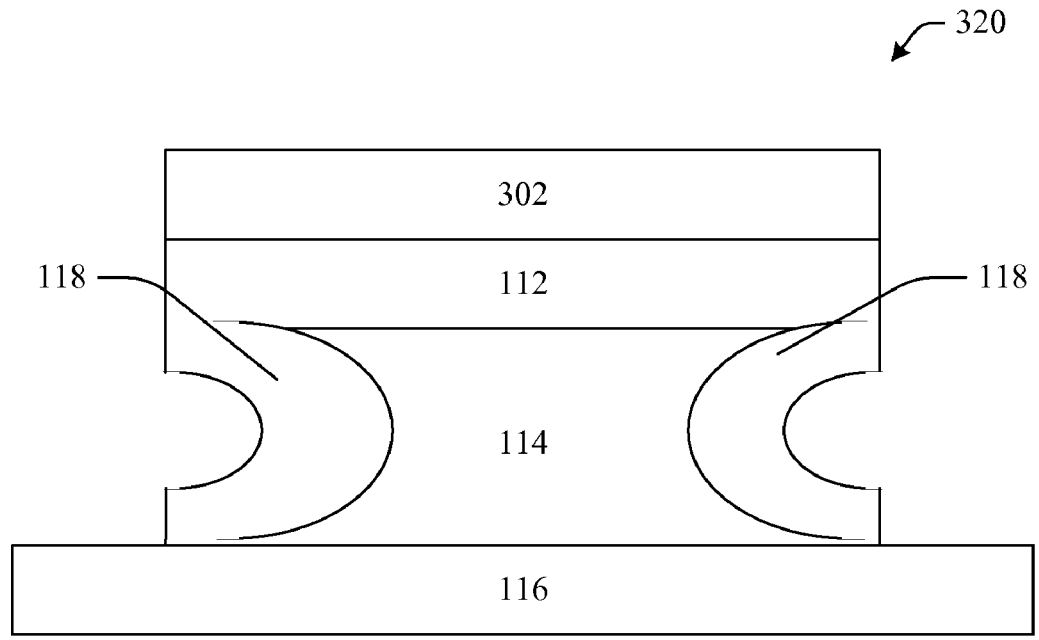

As shown in FIG. 3C, a stack 320 of a memory cell with a tunnel oxide layers 118 in each of the undercut regions 312 is illustrated. The tunnel oxide layer 118 can be formed over the substrate 116 and any exposed gate oxide layer 114 and the P+ polycrystalline silicon layer 112 (if any) in the undercut regions 312. It should be appreciated that the tunnel oxide layers 118 can be formed in various manners. For example, the tunnel oxide layer 118 can be formed by growing, plasma oxidation, or chemical vapor disposition. In one embodiment, the tunnel oxide layer 118 can be range from approximately 10-100 angstroms thick although other thickness can be used in accordance with other embodiments. It should be appreciated that the two undercut regions 312 can now contain two tunnel oxide layers 118 separated by empty space.

Figure 3D:
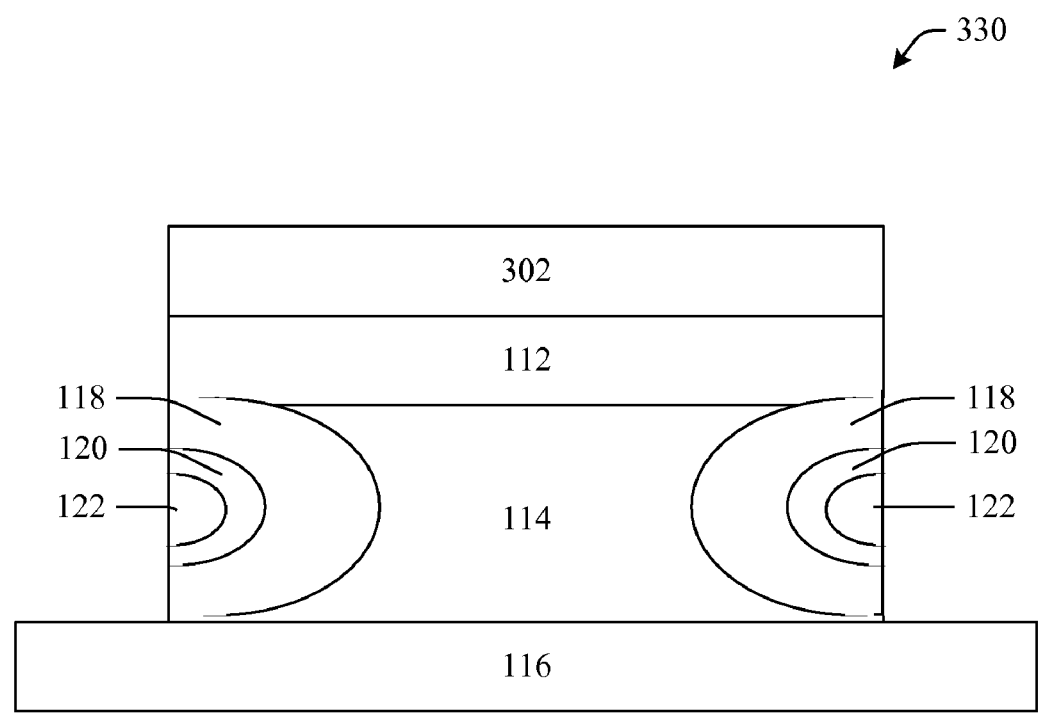

FIG. 3D illustrates a silicon rich nitride layer formed in a stack 340 of a memory cell in accordance with an embodiment of the disclosed subject matter. The stack 330 can include the formation of a silicon rich nitride (SiRN) layer 120 around the periphery of the tunnel oxide layer 118 in the undercut regions 312 of the stack 330. Charge trapping layers 122 can then be formed in between the two layers of silicon rich nitride 120. The charge trapping layers 122 can be formed so that each fills the remainder of the two undercut regions 312. In accordance with one aspect, polycrystalline silicon can be used for the charge trapping layers 122. In one embodiment, in order to avoid any seam void during the undercut filling with the silicon rich nitride layers 120 or the charge trapping layers 122, multiple cycles of partial disposition and partial etch can be performed.

During the process of forming the charge trapping layers 122, it should be appreciated that various manners can be used to remove any unwanted portions of the charge trapping layers 122, if any. For example, in one embodiment, any excess portions of the charge trapping layers 122 can be removed by a dry etch. In other embodiments, the unwanted portions of the charge trapping layers 122 can be removed by a wet etch, any combination of dry and wet etch, or careful oxidized (e.g., using thermal or plasma oxidation). Since portions of the charge trapping layers 122 can be removed except for the portions of the charge trapping layers 122 in the undercut regions 312, two physically separated charge storage elements can be formed for each memory cell (e.g., 106). In particular, the charge trapping layers 122 can be insulated from each other by the oxide materials (114 and 118).

It should be appreciated that instead of the silicon rich nitride (SiRN) layer 120, a layer of other materials can be used as an alternative in other embodiments. In addition, one will appreciate that in other embodiments, the charge storing element can comprise more or less than two charge trapping layers 122 and more or less than two tunnel oxide layers 118.

Figure 3E:
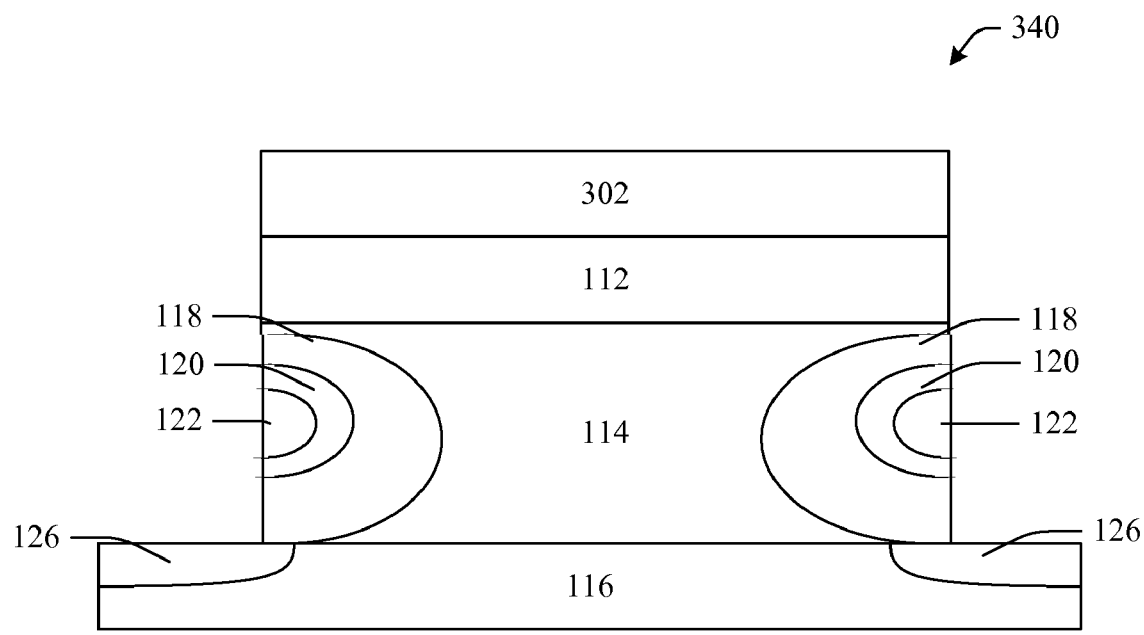
Figure 3F:
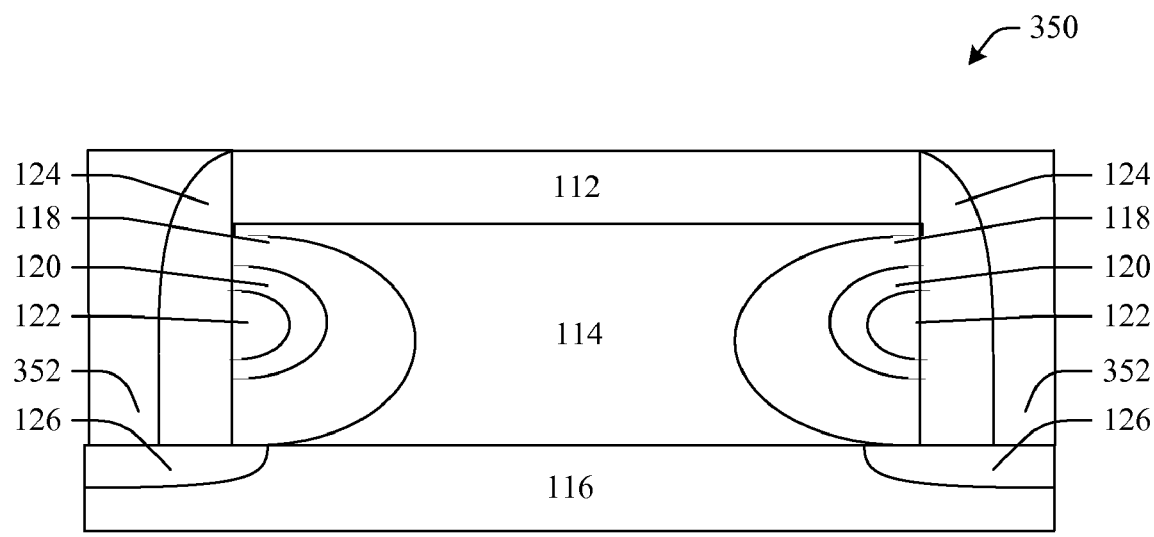

FIG. 3E illustrates bit lines associated with a stack 340 of a memory cell in accordance with an aspect of the disclosed subject matter. The stack 340 can have bit lines 126 that can be formed adjacent and underneath the memory cell stack 340. Bit lines 126 can be formed in the substrate 116, for example, by ion implementation. FIG. 3F illustrates a memory cell stack 350 with sidewall spacers in accordance with an embodiment of the disclosed subject matter. The stack 350 can include side wall spacers 124 that can be formed around the periphery of the P+ polycrystalline silicon layer 112. The gaps above the bit lines 126 and between the sidewall spacers 124 can be filled with silicon oxide 352, for example.

Figure 3G:
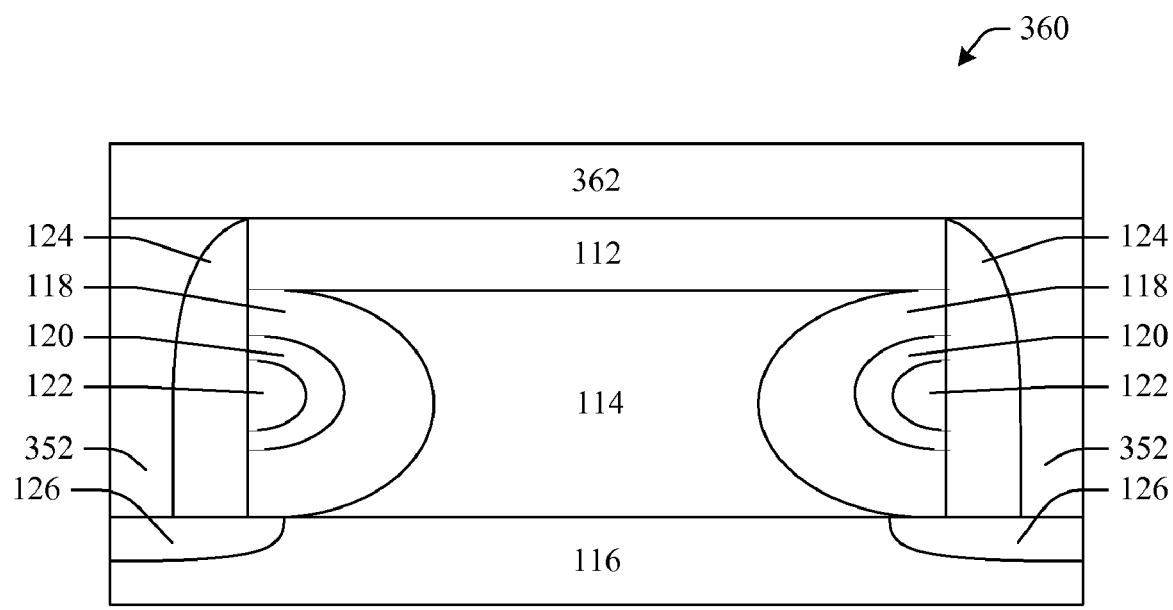

The hard masks 302 can be removed. In one embodiment, chemical mechanical processing (CMP) polish can be utilized to accomplish the removal. Turning to FIG. 3G, illustrated is a memory cell stack 360 with an additional polycrystalline layer and no hard masks in accordance with an embodiment of the disclosed subject matter. In stack 360, with the hard masks 302 removed, a second polycrystalline layer 362 can be deposited over the memory cell stack 360. In one embodiment, the second polycrystalline layer 362 can be approximately 200-2000 angstroms thick although other thicknesses can be employed in other embodiments. The second polycrystalline layer 362 can be then selectively masked and etched to form word lines associated with the memory cell, which can be one of a plurality of similarly formed memory cells in a memory array (e.g., 104) in a memory device (e.g., 102).

Figure 4A:
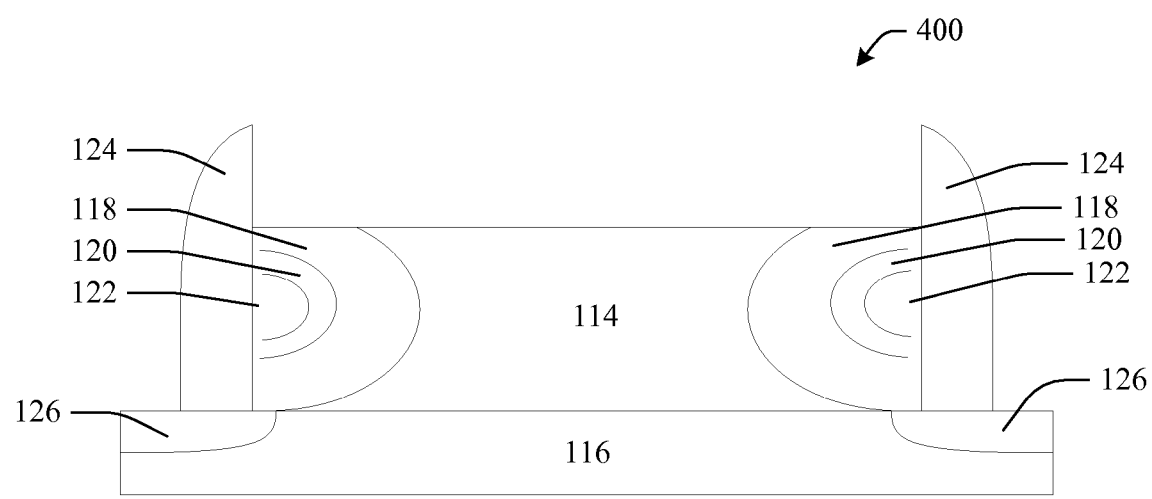
FIGS. 4A-4B illustrate gate replacement associated with a memory cell according to one embodiment.
Figure 4B:
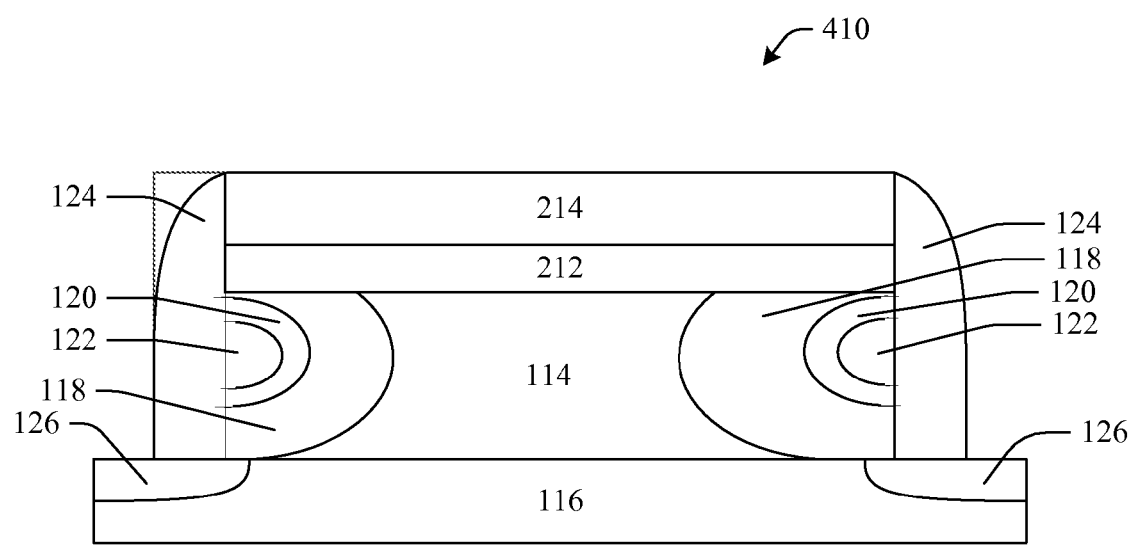

FIGS. 4A-4B illustrate gate replacement associated with a memory cell of a memory device. In particular, FIG. 4A illustrates a memory cell stack 400 without a gate electrode in accordance with an aspect of the disclosed subject matter. During formation of the memory cell, a memory cell stack (e.g., 300) can initially include a gate electrode (e.g., 112), such as P+ polycrystalline silicon or the conventional N+ polycrystalline polysilicon, which can be stripped away from a memory cell stack 400. Some or all of the top tunnel oxide layer 118 as well as part of the silicon oxide 114 layer can also be etched away, whether intentionally or as a byproduct of stripping the gate electrode layer.

FIG. 4B illustrates a memory cell stack 410 associated with a new gate electrode 420 that can be formed over the oxide layers (e.g., 118, 114) of memory cell stack 410 to replace the gate electrode that was stripped away. In accordance with one embodiment, where conventional stacks of N+ polycrystalline silicon and/or silicon oxide are used as starting material to form the gate electrode during the formation of the memory cell, the gate electrode layer can be stripped away. In one aspect, the gate electrode 214 can then be replaced with a high function work material, which, in one embodiment, can be comprised of P+ polycrystalline silicon. In accordance with other embodiments, the gate electrode 214 can be comprised a p-type metal or other high work function material.

In accordance with one embodiment, before re-depositing the gate electrode 214, a layer of high-K material (e.g., $Al_2O_3$, $HfO_2$) can be deposited, such as by using atomic layer disposition. In other embodiments, the oxide layers (e.g., 114, 118) can be regrown before re-depositing gate electrode 214.

Turning back to FIG. 1 and memory device 100, each of the plurality of memory cells 106 through 110 can store one or more bits of data. The memory cells (e.g., 106, 108, 110, etc.) can each include charge trapping elements (e.g., 122) that can independently have at least two data states (e.g., 2 states, 4 states, 8 states, 16 states, etc.). The data states can represent binary values such as a logical zero and a logical one. A logical one, for example, can be implemented by leaving the desired charge storage element in an unprogrammed state or blank program level. Logical zero, for example, can be implemented by storing an amount of charge in the desired charge storing element. This condition is also referred to as a charged state, a programmed state, a programmed level, or a charged program level. In other embodiments, logical one can be implemented in other ways.

In the illustrated embodiment, a memory cell (e.g., 106) can be a structurally symmetrical device allowing for programming, verifying and reading of the first charge storage element and the second charge storage element by respectively switching the roles of the bit lines 126 (source and drain) during those operations. Therefore, the bit lines 126 can be referred to interchangeably by the terms source and drain, depending on the charge storage element of interest and the operation being performed on the memory cell (e.g., 106).

The programming technique to store the charged program level with either of the charge storage elements can involve hot electron injection. However, it should be appreciated that modifications to the programming techniques can be made to accommodate variations in the specific memory device used.

Using hot electron injection, the first charge storage element can be programmed to a desired charged program level by applying a predetermined drain voltage potential (e.g., about 4 volts to about 6 volts, in one embodiment) to a bit line 126 that can function as the drain and a predetermined gate voltage potential (e.g., approximately 9V-10V, in an embodiment) to the gate electrode (e.g., P+ polycrystalline silicon layer 112). The other bit line 126 can function as the source for the hot electron injection programming of the first charge storage element, and can be grounded or alternatively connected to a bias voltage potential.

The respective voltages applied to the gate electrode 112, the source and the drain can generate a vertical electric field through the tunnel oxide layers 118 and the gate oxide layer 114 to the charge trapping layers 122 with a channel from the source to the drain. At a given threshold voltage, the channel can invert such that electrons can be drawn off the source and begin accelerating toward the drain. As the electrons move along the length of the channel, the electrons can gain energy and upon attaining sufficient energy, the electrons can move over the potential barrier of the tunnel oxide layer 118 and the silicon nitride layer 120 into the charge trapping layers 122 where the electrons can become trapped.

The foregoing technique to program the first charge storage element can be used to program the second charge storage element with the source and drain reversed.

Reading of the charge storage elements of the memory cell can be performed using, for example, a reverse read operation. For example, to read the first charge storage element, a voltage potential can be applied to the conductive region opposite the first charge storage element and a voltage potential can be applied to the gate electrode (e.g., via a word line). The bit line 126 adjacent to the first charge storage element, which can act as the source during read operations, can be grounded. In order to read the second charge storage element, the roles of the bit lines 126 can be reversed. The read operation drain voltage can function to mask, or "cover up," charge stored by the "unread" charge trapping layer 122. During the read operation, an amount of current can be drawn across the channel that can be compared against a reference current to determine the data state of the "read" charged storage element.

Erasing the charge storage elements can be accomplished by various erase techniques, including an FN erase operation. As is described more fully below, an FN erase can be effectively employed due to the presence of a tunnel barrier in the memory cell (e.g., 106). For example, the use of a relatively high work function gate electrode 112 (e.g., a P+ polycrystalline silicon or a P-type metal) can sufficiently eliminate tunneling from the gate electrode, across the top tunnel oxide layer 118 and the top silicon nitride layer into the charge trapping layer(s) 122.

In one embodiment, both charge storage elements can be erased simultaneously by applying a negative gate erase voltage to the gate electrode 112 and grounding the source and drain (bit lines 126), and substrate 116. In one embodiment, a relatively large negative gate erase voltage (e.g., approximately −20 volts) can be applied to the gate electrode. Alternatively, smaller negative gate erase voltages (e.g., between approximately −4 volts to −10 volts) can be applied. In yet another embodiment, the gate voltage can be approximately −13 volts to −17 volts, while the source and drain can be floated or grounded and the substrate can be grounded. In at least some embodiments, the voltage used to erase can be reduced versus a conventional N+ gate electrode.

Figure 5:
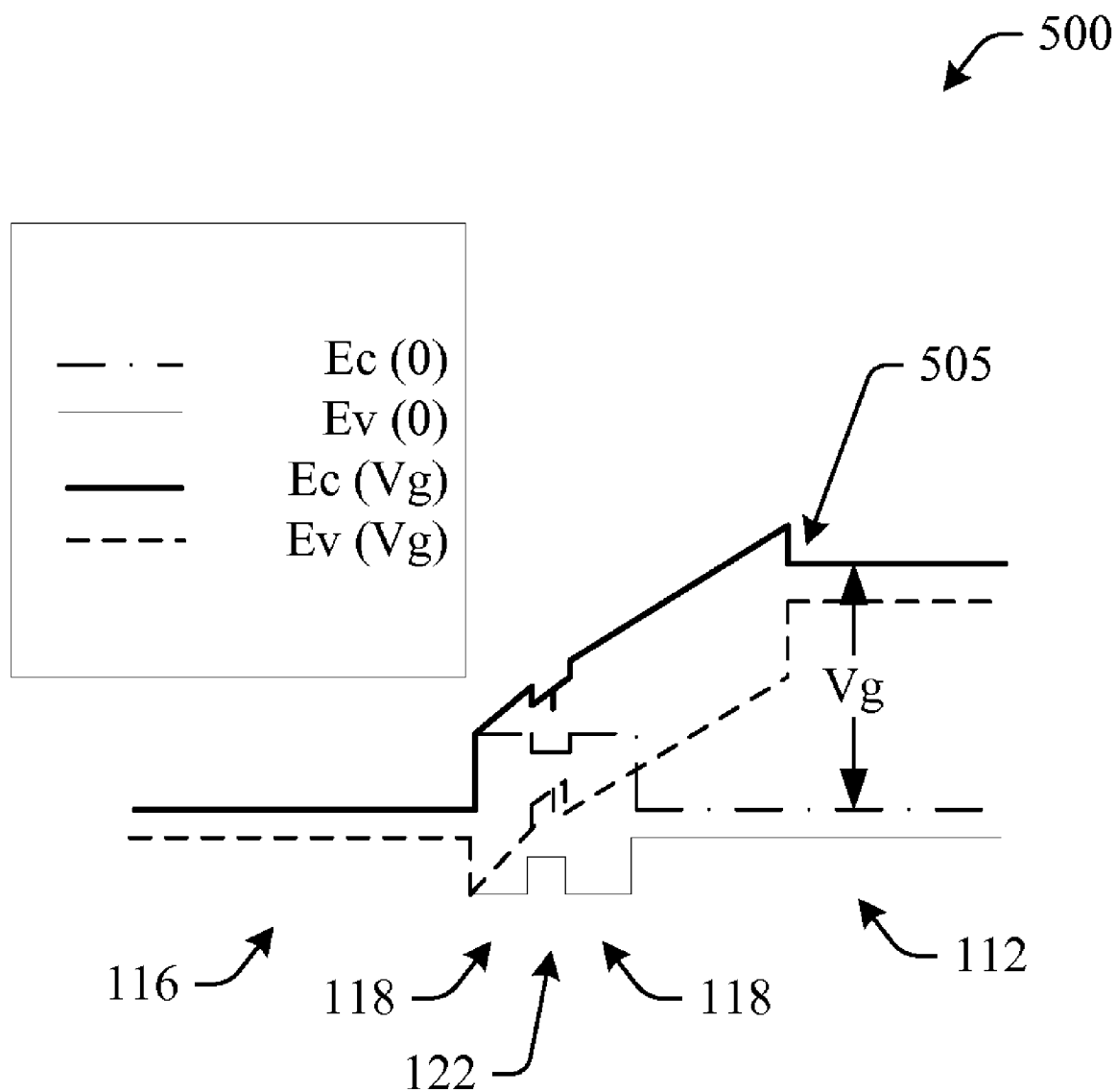
FIG. 5 is an energy band diagram associated with a memory cell of a memory device according to one embodiment.

FIG. 5 represent energy band diagrams 500 of a neutral state for a memory device having a P+ polysilicon gate electrode in accordance with one embodiment. Regions 116, 118, 122, 118, and 112 represent the substrate, bottom tunnel oxide layer, charge trapping layer, top oxide layer, and P+ polycrystalline silicon layer (e.g., gate electrode), respectively. The use of a P+ polycrystalline silicon as the gate electrode can provide an increased barrier height (as shown by triangular barrier 505), as compared to conventional materials (e.g., N+ polycrystalline silicon), and can thereby can prevent or inhibit charge, in the form of electrons, from overcoming the barrier potential of the top tunnel oxide layer and tunneling into the charge trapping layer 122 during erase operations (e.g., FN erase). One will appreciate that "barrier height," as used herein, refers to the size of the energy bandgap between the valence band and conduction band for a given material. The increased barrier height can sufficiently minimize and/or reduce, if not effectively prevent or otherwise "shuts off," tunneling of electrons from the gate electrode (e.g., 112), through the top tunnel oxide layer 118, into the charge trapping layer 122 during a channel or FN erase operation. As shown in the alternative embodiments below, other materials, such as a P-type metal, can be used as gate electrode 112. In another embodiment, a layer (e.g., 212) of high-K material can be employed below the gate electrode (e.g., 112, 214) in the memory cell stack, which can also further increase the barrier height.

In accordance with one embodiment of the disclosed subject matter, with reference to FIG. 5, the energy level of the conduction band (Ec) can be approximately 1.1 eV (electron-volts) greater than the energy level of the valence band (Ev) within the P+ polycrystalline silicon gate electrode 112. A conventional gate electrode having an N+ dopant concentration is characterized by a fermi level, which is very close to the conduction band. For a memory device having an N+ gate electrode, the size of the barrier height (e.g., triangular barrier) can be approximately 3.1 eV. In contrast, the gate electrode with a P+ dopant concentration can be characterized by a fermi level just above the valence band. Therefore, for a memory cell having a P+ polycrystalline silicon gate electrode, the size of the triangular barrier 505 can be approximately 4.2 eV. While the approximately 1.1 eV difference in the height of the triangular barrier 505 for a P+ gate electrode can be significant for some operations, the effect on tunneling current from the gate electrode to the charge storing layer in the charge storage element during FN erase can be very large in light of the fact that the tunneling rate can decrease exponentially as the barrier height increases. Thus, both bits can be effectively erased with virtually no tunneling being encountered through the top dielectric layer. The increased barrier height associated with the P+ polycrystalline silicon gate electrode, in turn, can allow for a lower gate voltage to be applied across the stack to facilitate an FN channel erase operation, as compared to applied gate voltages associated with the conventional N+ gate electrode. In accordance with one embodiment, the applied gate voltage associated with the P+ polycrystalline silicon gate electrode can be approximately 1 volt to 2 volts lower than the applied gate voltage associated with the conventional N+ gate electrode.

Similar results can be achieved using other gate electrode materials, including p-type metals, nickel silicide, tungsten, cobalt silicide and P+ silicon carbide, for example. In general, similar results can be achieved by a material with a high work function (e.g., between about 4.0 eV and 5.2 eV). In addition, similar results can be achieved, when the top oxide layer is replaced with a high-K material. High-K materials can include materials that have a dielectric constant above 3.9, which is the dielectric constant of oxide.

Figure 6:
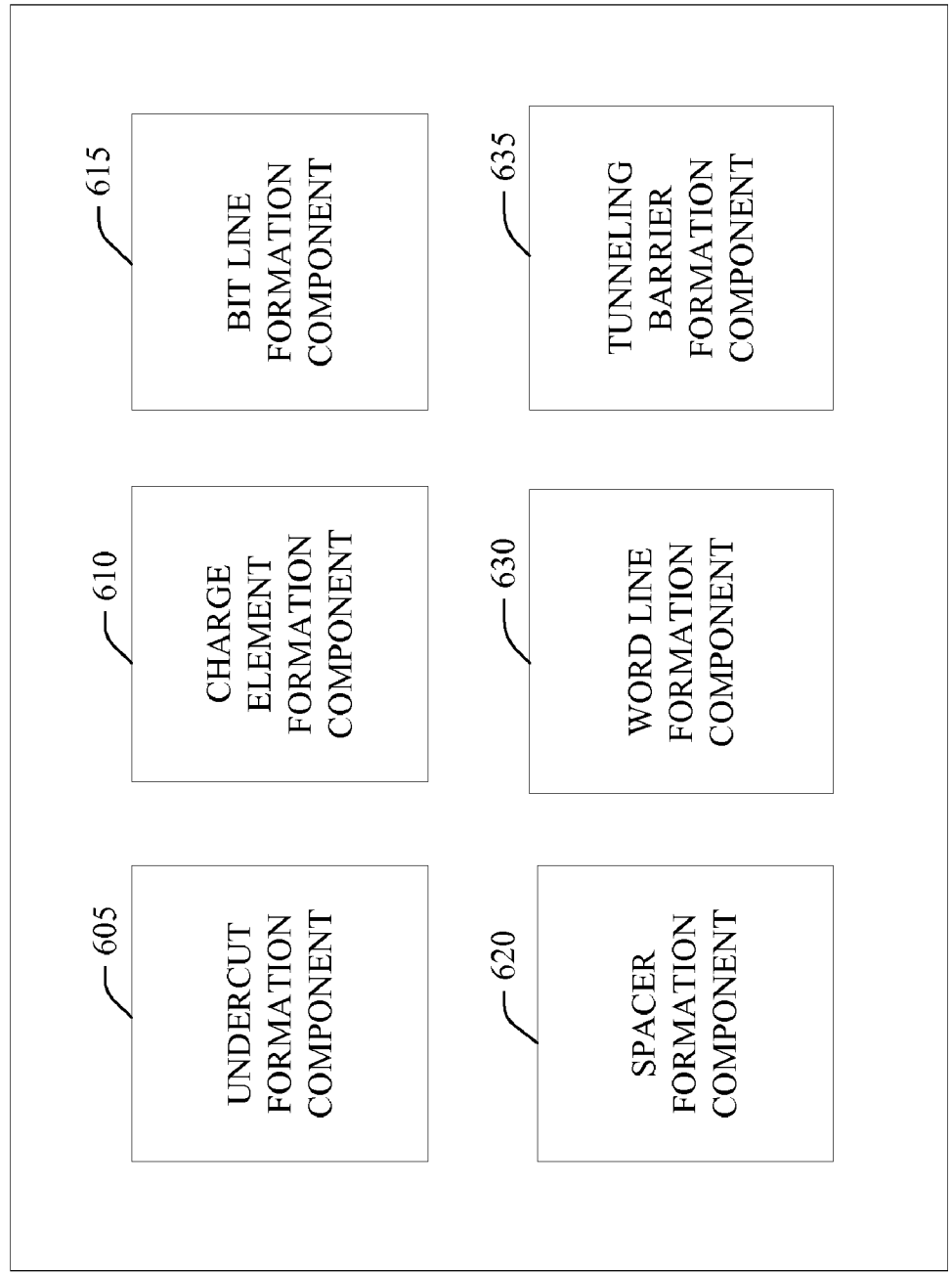
FIG. 6 is a block diagram of a system for formation of a memory cell of a memory device according to one embodiment.

Referring to FIG. 6, illustrated is a system 600 that facilitates fabrication of memory cells in a memory device in accordance with an embodiment of the disclosed subject matter. The illustrated system 600 can include an undercut component 605 that can form at least two undercut regions in each memory cell stack (e.g., 300). System 600 can also include a storage element component 610 that can form at least two charge storage elements in each layer of silicon oxide. For example, for each layer, the storage formation component 610 can facilitate depositing a layer of tunnel oxide in the undercut region, a silicon rich nitride layer over the tunnel oxide, and then a charge trapping layer in the remainder of the undercut region to thereby form the charge storage elements of the memory cell.

System 600 can further contain a bit line component 615 that can form bit lines associated with each memory cell in the substrate between stacks. System 600 also can include a spacer component 620 that forms a sidewall spacer for each side of a memory cell and can fill in the space between memory cell stacks. System 600 can contain a word line formation component 630 that can form word lines respectively associated with memory cells in the memory array of the memory device.

System 600 can include a tunneling barrier formation component 635 that can facilitate formation of a tunneling barrier in each memory cell. In accordance with one embodiment, the tunneling barrier formation component 635 can strip the gate electrode from the memory cell stacks and can also etch a portion of one or more oxide layers adjacent to the gate electrode on each memory cell stack.

In one embodiment, the tunneling barrier formation component 635 can re-deposit a gate electrode on top of the etched memory cell stack, where the gate electrode can be comprised of a P+ polycrystalline silicon or p-type metal material. In accordance with another embodiment, the tunneling barrier formation component 635 can deposit a layer of high-K material on top of the now etched stack, such as using atomic layer disposition, for each memory cell stack. The tunneling barrier formation component 635 can re-deposit a gate electrode, which can be comprised of a P+ polycrystalline silicon material or p-type metal material, on top of the layer of high-K material for each memory cell stack.

One will appreciate that the tunneling barrier component 635 can be implemented with other subcomponents. For example, an oxide redeposit subcomponent can be used to regrow the oxide before a new gate electrode is placed on top of the memory cell stacks.

Figure 7:
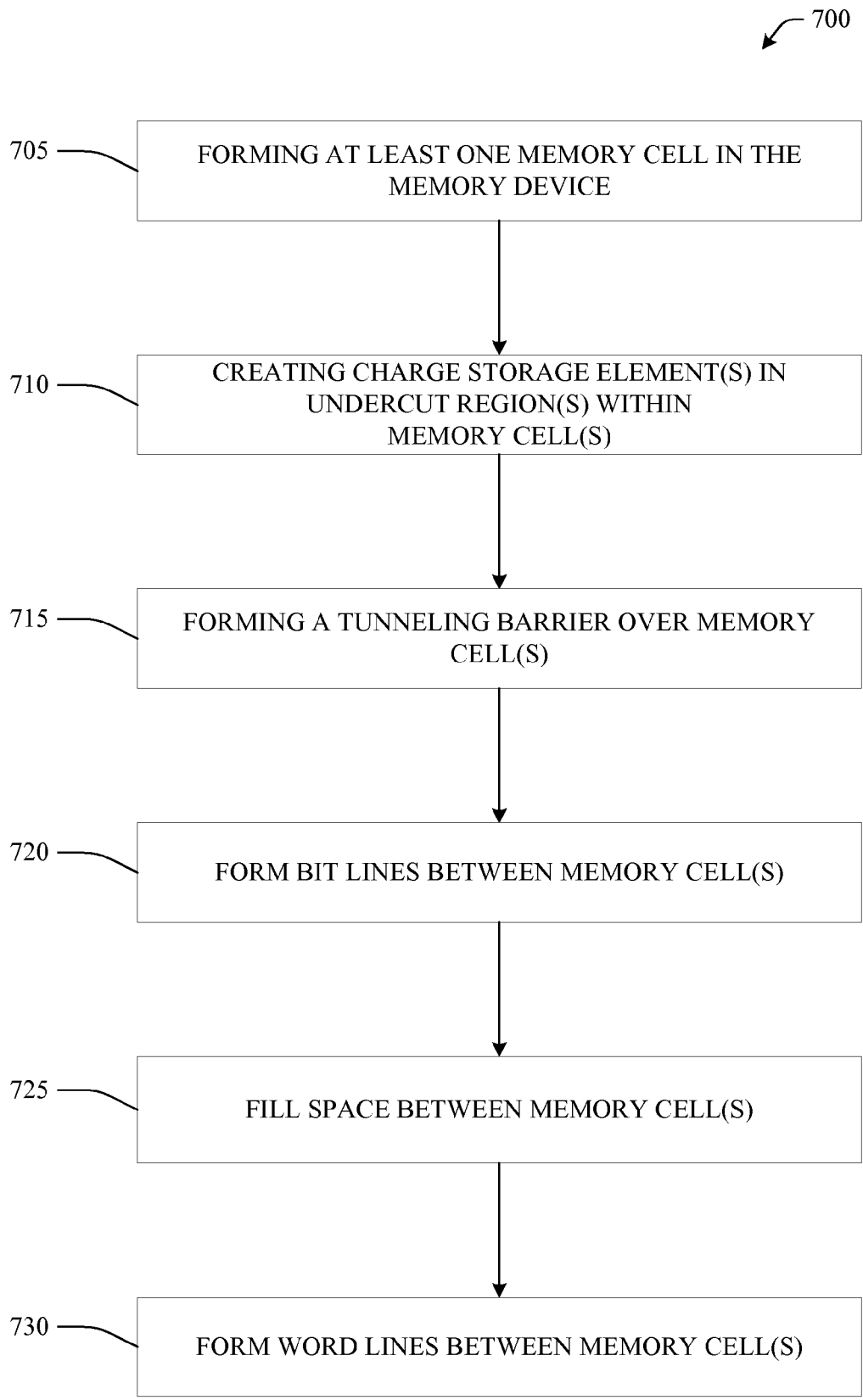
FIG. 7 is a flowchart for a methodology that facilitates creating a memory device according to one embodiment.
Figure 8:
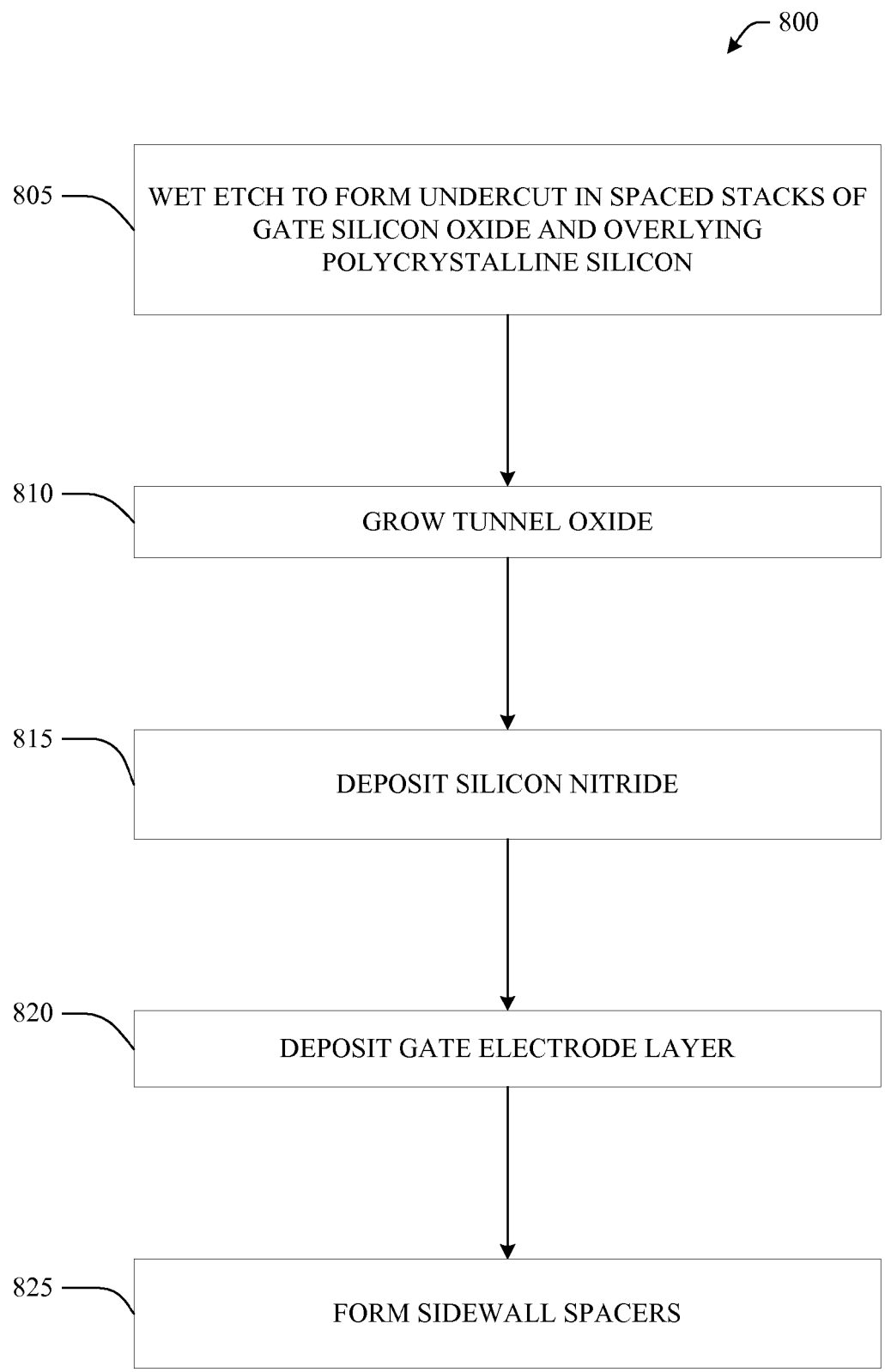
FIG. 8 is a flowchart of a methodology that facilitates creating a charge storage element in a memory cell of a memory device.
Figure 9:
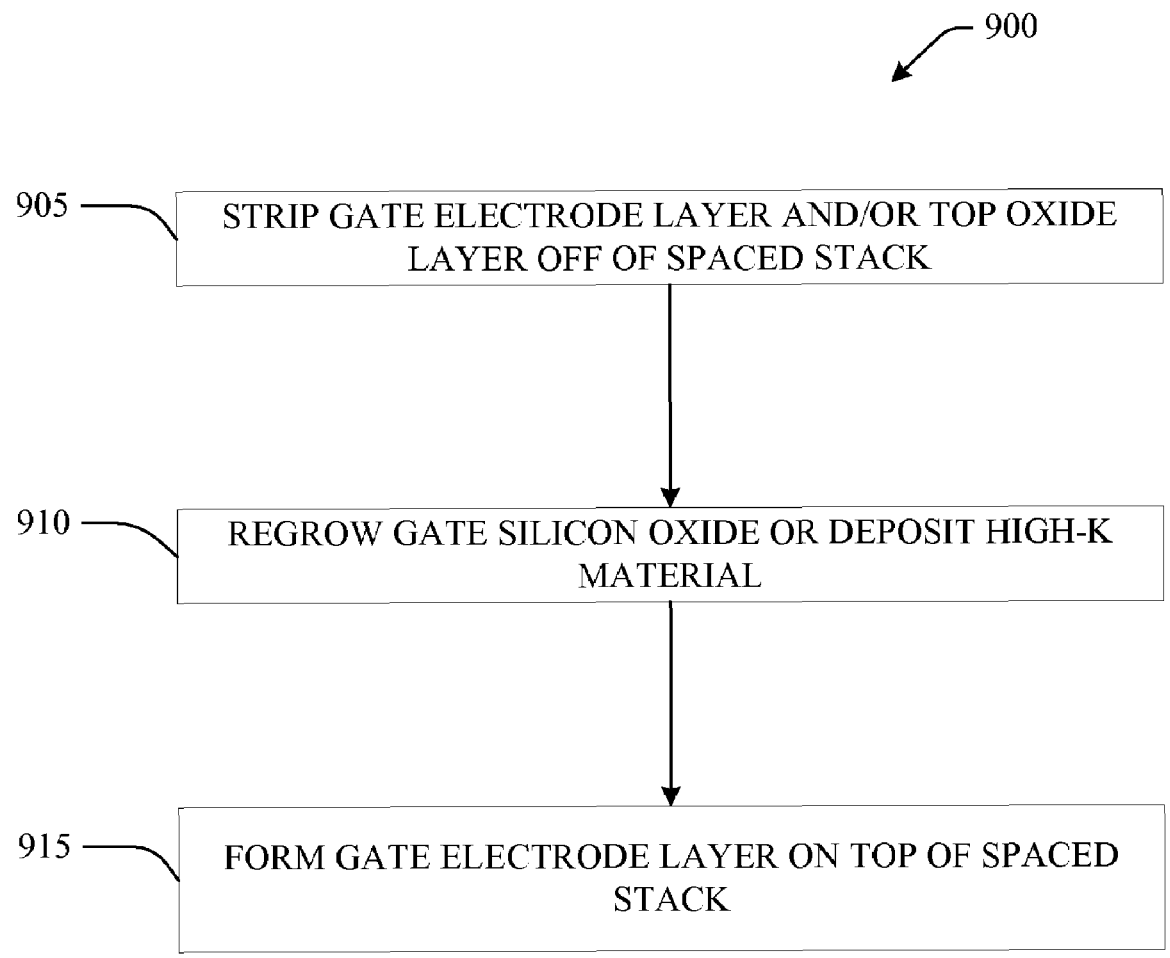
FIG. 9 is a flowchart of a methodology that facilitates gate replacement in accordance with an aspect of the disclosed subject matter.

FIGS. 7-9 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 7, a methodology 700 for fabricating a memory device having a plurality of memory cells in accordance with the disclosed subject matter is illustrated. At 705, at least one memory cell can be formed in the memory device. In one embodiment, a memory device can be comprised of a plurality of memory cells. At 710, charge storage elements can be formed in one or more undercut regions within each memory cell. Formation of the charge storage elements can be performed as more fully described herein, for example with regard to methodology 800.

At 715, a tunneling barrier can be formed in or over each memory cell. In accordance with various embodiments, the tunneling barrier can be part of the initial memory cell stack, such as those illustrated in FIGS. 3A-3G and described more fully herein with regard to stack 300, 310, 320, 330, 340, 350, and/or 360. In accordance with other embodiments, the tunneling barrier can be formed after the top layer of a memory cell is stripped away, such as described herein with regard to stack 400 and stack 410, for example.

At 720, bit lines can be formed in the semiconductor substrate. The bit lines can be respectively associated with each memory cell of the memory device, such that selection of a particular bit line (and word line) through application of a predetermined voltage level can facilitate access to the associated memory cell. In one embodiment, bit lines can be implanted using sidewall spacers as a mask. At 725, the space between the memory cells can be filled, for example, with silicon oxide filler. At 730, word lines can be formed over the silicon oxide filler and the memory cells. The word lines can be respectively associated with each memory cell such that selection of a particular word line (and bit line) through application of a predetermined voltage level can facilitate access to the associated memory cell. In accordance with one aspect, the masks (e.g., 302), sidewall spacers (e.g., 124), and the silicon oxide filler (e.g., 352) can be polished down. Then, a layer of polycrystalline silicon can be deposited and subsequently etched to form word lines. At this point, methodology 700 can end.

Referring to FIG. 8, depicted is a methodology 800 of forming a charge storing element(s) in a memory cell of a memory device in accordance with the disclosed subject matter. This method can be performed, for example, with regard to creating charge storage element(s) in undercut region(s) in a memory cell stack, such as described with regard to reference numeral 710 of methodology 700. At 805, a wet etch can be used to form one or more undercut regions in the memory cell. In accordance with an embodiment, the undercut region (s) can be formed under a layer (e.g., gate electrode 112) that can be comprised of a high function work material, such as P+ polycrystalline silicon material or other p-type metal material. At 810, a tunnel oxide layer can be grown in each of the undercut regions. At 815, a layer of silicon rich nitride (SiRN) can be deposited over the tunnel oxide layer. At 820, polycrystalline silicon can be deposited as charge trapping material (e.g., 122) over the silicon rich nitride layer so that it fills, or substantially fills, the remainder of the undercut region. In order to avoid a seam void during the undercut filling, multiple cycles of partial deposition and partial etch can be performed. Undesired excess portions of charge trapping material outside of the undercut region, if any, can be removed. At 825, sidewall spacers can then be formed on the stacks sufficient to cover any remaining exposed charge trapping material. For example, in one embodiment, a silicon oxide layer can be formed and etched to form sidewall spacers around the periphery of the P+ polycrystalline silicon layer (e.g., 112). At this point, methodology 800 can end.

Referring to FIG. 9, depicted is a methodology 900 for replacing a gate electrode to facilitate forming a memory cell in accordance with an embodiment of the disclosed subject matter. Gate replacement can be utilized to facilitate forming the tunneling barrier, as described herein with regard to reference numeral 715 of methodology 700, for example. In accordance with one embodiment of the disclosed subject matter, methodology 900 can be employed after the undercut region(s) and the charge storage element(s) have been formed in the memory cells. At 905, the gate electrode layer (e.g., 112) of a memory cell stack can be stripped off the spaced stack/memory cell. The gate electrode stripped can be P+ polycrystalline silicon material or a conventional N+ polycrystalline silicon material, for example. In one embodiment, a dry etch can be utilized, although it is to be appreciated that, in accordance with other embodiments, different stripping methods can be employed. It to be further appreciated that some of the oxide layers, such as the gate silicon oxide layer, can also etched off when stripping the polycrystalline silicon layer, whether intentionally or as a byproduct of the etching process.

At 910, the gate silicon oxide can be regrown and/or a high-k material can be deposited on the memory cell stack above the undercut region(s) and charge trapping layer(s) (e.g., charge storage element(s)). In accordance with one embodiment, the gate silicon oxide can be regrown. In accordance with another embodiment, a high-K material (e.g., aluminum oxide, hafnium-based dielectric material) can be deposited, for example, using atomic layer deposition.

At 915, a new gate electrode layer (e.g., of polycrystalline silicon) can be formed (e.g., deposited) on top of the spaced stack/memory cell. In accordance with an embodiment, the gate electrode layer can be comprised of a high work function material, such as P+ polycrystalline silicon material or p-type metal. In one embodiment, a memory cell stack can initially contain a gate electrode layer comprised of N+ polycrystalline silicon, which can be stripped away at reference numeral 905, and can be replaced with P+ polycrystalline silicon when the new polycrystalline layer is formed at 915. At this point, methodology 900 can end.

Figure 10:
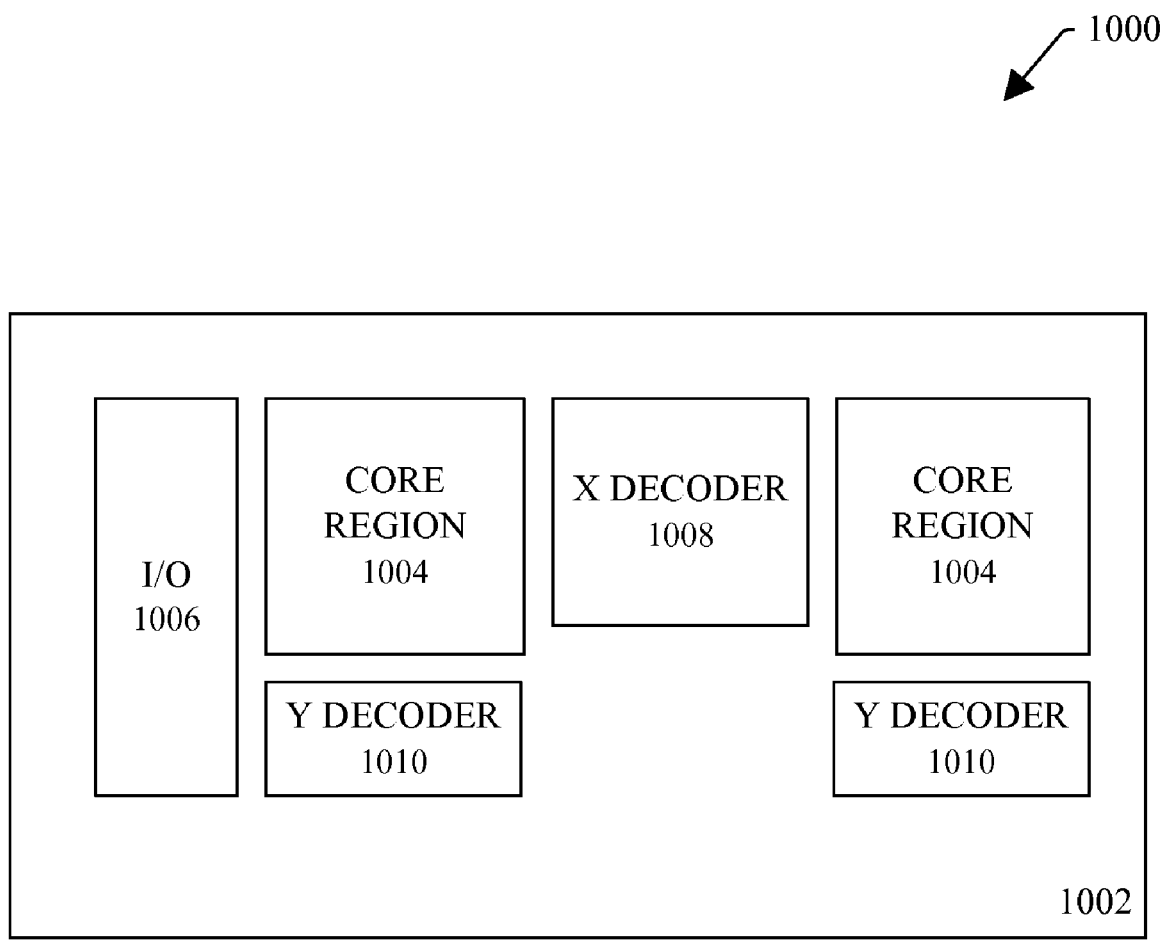
FIG. 10 is a block diagram of exemplary components of a memory device according to one embodiment.

FIG. 10 illustrates a top view of an exemplary multi-bit flash memory device 1000 according to one embodiment. The memory device 1000 generally includes a semiconductor substrate 1002 in which one or more higher-density core regions 1004 can be formed. Each core region 1004 typically can include one or more M by N memory arrays (e.g., 104, 204) of individually addressable, substantially identical multi-bit memory cells (e.g., 106, 108, 110, 206, 208, 210). The lower-density peripheral regions can typically include input/output (I/O) circuitry 1006 and programming circuitry for selectively addressing the individual memory cells. The programming circuitry can be represented in part by and can include one or more x-decoders 1008 and one or more y-decoders 1010 that cooperate with the I/O circuitry 1006 for selectively connecting a source, gate, and/or drain of selected addressed memory cells to predetermined voltages or impedances to effect designated operations (e.g., programming, reading, and erasing, and deriving necessary voltages to effect such operations) on the respective memory cells.

Figure 11:
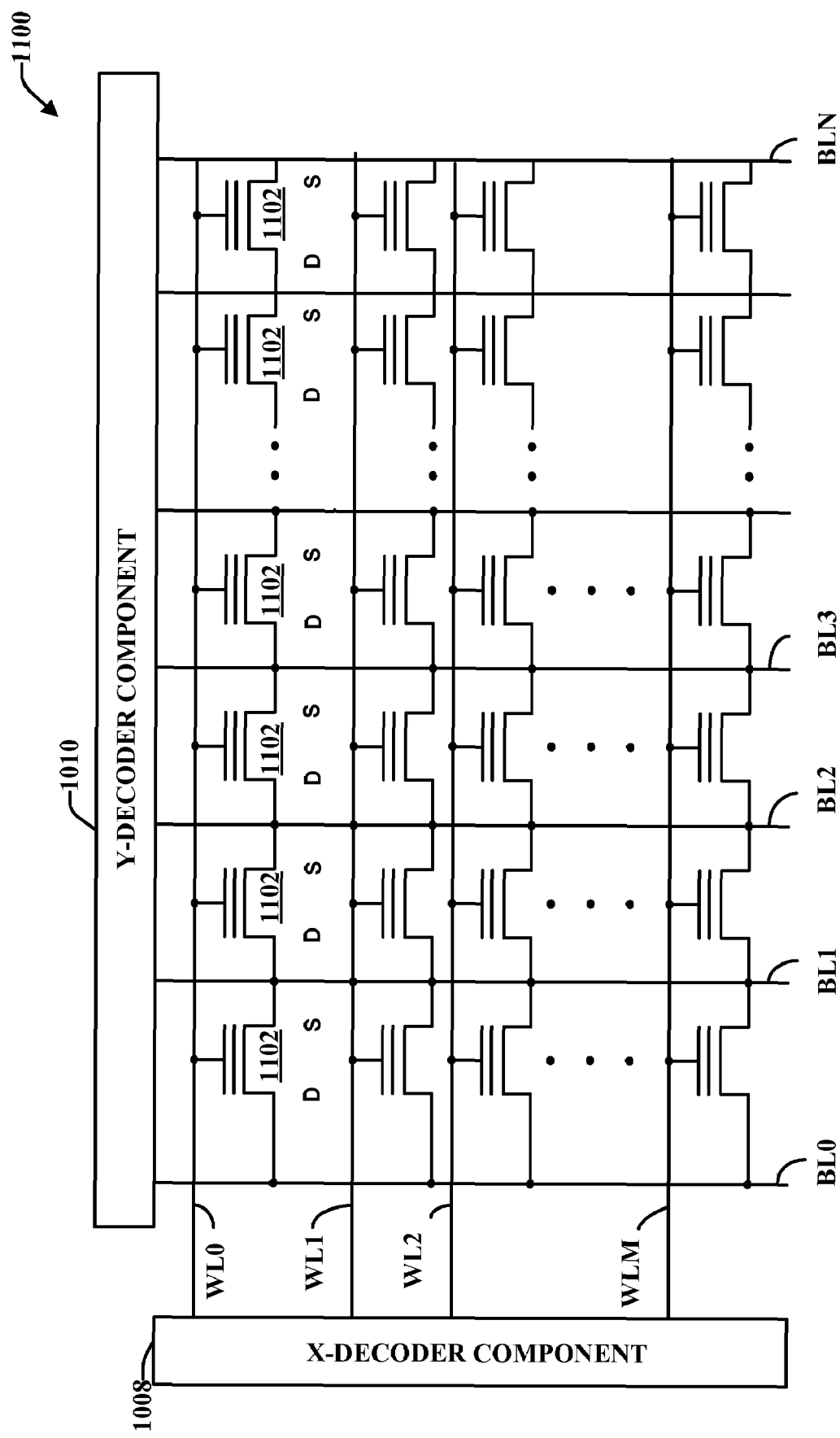
FIG. 11 is a schematic of a memory array within an exemplary memory device.

FIG. 11 is an illustration of a of a portion of a memory device 1100 that can store data in accordance with an embodiment of the disclosed subject matter. The portion of the memory device 1100 can be the same or similar to respective components described, for example, with regard to device 1000. The device 1100 can include a plurality of memory cells 1102 that each can be comprised of a drain/source, gate, and source/drain. Each memory cell 1102 can be a multi-level memory cell such that each memory cell can have more than two data states (e.g., 4 distinct levels). Further, each memory cell 1102 can be a multi-bit memory cell such that more than bit of data can be stored therein.

It is to be appreciated that while the memory cells 1102 are shown as being respectively associated with a drain and a source, in accordance with one embodiment, where the memory cell 1102 contains charge storage elements on two sides of the cell 1102 that can be programmed, the drain can act as the source, and the source can act as the drain depending on which portion of the memory cell is being charged during a given operation.

The device 1100 can include an X-decoder component(s) 1008 (e.g., WL decoder) and a Y-decoder component(s) 1010 (e.g., BL decoder) that can each respectively decode inputs/outputs during various operations (e.g., programming, reading, verifying, erasing) that can be performed on the memory cells 1102. The X-decoder component 1008 and Y-decoder component 1010 can each receive address bus information from a host processor (not shown) and/or system controller (not shown) or the like, and can utilize such information to facilitate accessing or selecting the desired memory cell(s) (e.g., memory location(s)) associated with the command. The memory cells 1102 can be formed in M rows and N columns. A common WL can be attached to the gate of each memory cell 1102 in a row, such as word-lines WL0, WL1, WL2, through WLM. A common BL can be attached to each cell 1102 in a column, such as bit-lines BL0, BL1, through BLN. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 1102 through the WLs and BLs to facilitate performing operations, such as program, read, erase (e.g., FN erase), and the like.

Figure 12:
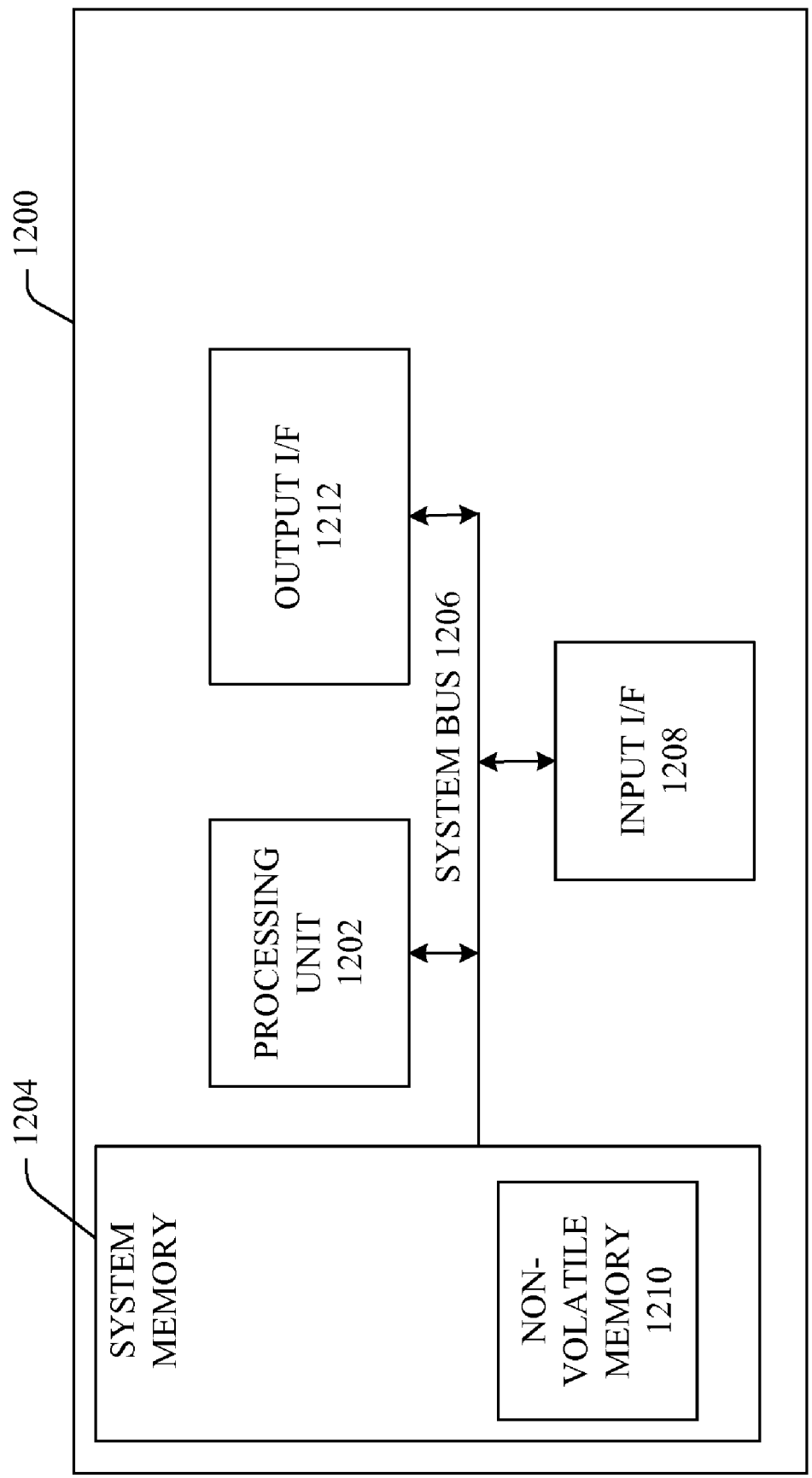
FIG. 12 is a block diagram of an exemplary electronic device that utilizes the memory system.

Referring to FIG. 12, a block diagram of an exemplary, non-limiting electronic device 1200 that can utilize a memory device is illustrated. The memory device employed in electronic device can be a non-volatile memory device, such as any of the memory devices described herein, including, for example, memory device 100, memory device 200, memory device 1000, and/or memory device 1100.

The electronic device 1200 can be, but is not limited to, a computer, a laptop computer, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a digital camera, an electronic game (e.g., video game), an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system (e.g., global position satellite (GPS) system), secure memory devices with computational capabilities, devices with tamper-resistant chips, an electronic device associated with industrial control systems, an embedded computer in a machine (e.g., an airplane, a copier, a motor vehicle, a microwave oven), and the like.

Components of the electronic device 1200 can include, but are not limited to, a processing unit 1202, a system memory 1204 (with non-volatile memory 1210), and a system bus 1206 that can couple various system components including the system memory 1204 to the processing unit 1202. The system bus 1206 can be any of several types of bus structures including a memory bus or memory controller, a peripheral bus, or a local bus using any of a variety of bus architectures.

Electronic device 1200 can typically include a variety of computer readable media. Computer readable media can be any available media that can be accessed by the electronic device 1200. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, non-volatile memory (e.g., 1210) or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1200. Communication media typically embodies computer readable instructions, data structures, program modules or other data in a modulated data signal such as a carrier wave or other transport mechanism and includes any information delivery media. A basic input/output system (BIOS), containing the basic routines that help to transfer information between elements within electronic device 1200, such as during start-up, can be stored in the system memory 1204. The system memory 1204 typically also contains data and/or program modules that can be immediately accessible to and/or presently be operated on by processing unit 1202. By way of example, and not limitation, system memory 1204 can also include an operating system, application programs, other program modules, and program data.

The system memory 1204 can include computer storage media in the form of volatile and/or nonvolatile memory, such as non-volatile memory 1210 (e.g., memory device 100, memory device 200). The non-volatile memory 1210 can be a flash memory (e.g., single-bit flash memory, multi-bit flash memory), read only memory (ROM), programmable ROM (PROM), electrically programmable ROM (EPROM), electrically erasable programmable ROM (EEPROM), and the like. Further, the flash memory can be comprised of NOR flash memory and/or NAND flash memory. The non-volatile memory 1210 can be removable or non-removable. For example, the non-volatile memory 1210 can be in the form of a removable memory card or a USB flash drive.

A user can enter commands and information into the electronic device 1200 through input devices (not shown) such as a keypad, microphone, tablet or touch screen although other input devices can also be utilized. These and other input devices can be connected to the processing unit 1202 through input interface 1208 that can be connected to the system bus 1206. Other interface and bus structures, such as a parallel port, game port or a universal serial bus (USB) can also be utilized. A graphics subsystem (not shown) can also be connected to the system bus 1206. A display device (not shown) can be also connected to the system bus 1212 via an interface, such as output interface 1212, which can in turn communicate with video memory. In addition to a display, the electronic device 1200 can also include other peripheral output devices such as speakers (not shown), which can be connected through output interface 1212.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

While the subject innovation has been described in connection with the preferred embodiments of the various figures, it is to be understood that other similar embodiments can be developed or modifications and additions can be made to the described embodiment for performing the same function in accordance with the disclosed subject matter without deviating therefrom.

What is claimed is:

1. A memory device, comprising:
   a plurality of memory cells, each memory cell comprised of a stack formed over a substrate, the stack having a gate oxide layer and an overlying layer that acts as a tunneling barrier, the stack having at least one undercut region formed under the overlying layer and is adjacent to the gate oxide layer; and
   at least one charge storage element formed in the at least one undercut region, the overlying layer comprising at least one of a P+ polycrystalline silicon or a P-type metal that minimizes a number of electrons tunneling from the overlying layer to the at least one charge storage element, which is in at least one memory cell of the plurality of memory cells, during a Fowler-Nordheim (FN) erase operation to erase the at least one charge storage element, wherein each of the at least one charge storage element consists of a tunnel oxide layer formed over the substrate in the undercut region, a silicon rich nitride layer formed over the tunnel oxide layer and a layer of polysilicon.

2. The memory device of claim 1, further comprising:
   silicon oxide filler formed in the space between adjacent stacks; and
   a plurality of word lines formed over the silicon oxide filler and the stacks, each of the word lines is respectively associated with each of the memory cells.

3. The memory device of claim 1, the overlying layer comprises P+ polycrystalline silicon.

4. The memory device of claim 1, the overlying layer comprises a P-type metal.

5. The memory device of claim 1, the overlying layer comprises a high-K material.

6. The memory device of claim 1, the overlying layer comprises P+ polycrystalline silicon and a high-K material.

7. The memory device of claim 6, the high-K material comprising a material having a dielectric constant greater than 3.9.

8. The memory device of claim 1, the memory device is a non-volatile memory device.

9. An electronic device comprising the memory device of claim 1.

10. The electronic device of claim 9, wherein the electronic device comprises at least one of a computer, a laptop computer, network equipment, a media player, a media recorder, a television, a smart card, a phone, a cellular phone, a smart phone, an electronic organizer, a personal digital assistant, a portable email reader, a digital camera, an electronic game, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system, a secure memory device with computational capabilities, a device with at least one tamper-resistant chip, an electronic device associated with industrial control systems, or an embedded computer in a machine, or a combination thereof, wherein the machine comprises one of an airplane, a copier, a motor vehicle, or a microwave oven.

11. A method for fabricating a memory device, comprising:
   forming at least one memory cell in the memory device;
   creating at least one charge storage element in at least one undercut region within the at least one memory cell, wherein each of the at least one charge storage element consists of a tunnel oxide layer formed over the substrate in the undercut region, a silicon rich nitride layer formed over the tunnel oxide layer and a layer of polysilicon; and
   forming a tunneling barrier on top of the at least one memory cell, the tunneling barrier is at least one of a high work function material or a high-K material, or a combination thereof, the high function work material comprising one of a P+ polycrystalline silicon or a P-type metal, which minimizes a number of electrons tunneling from a gate electrode of the at least one memory cell to the at least one charge storage element during a Fowler-Nordheim (FN) erase operation to erase the at least one charge storage element.

12. The method of claim 11, the forming the tunneling barrier on top of the at least one memory cell further comprises forming a layer comprising the P+ polycrystalline silicon on top of the at least one memory cell.

13. The method of claim 12, the forming a tunneling barrier on top of the at least one memory cell further comprises forming a layer comprising the high-K material on top of the at least one memory cell underneath the layer comprising the P+ polycrystalline silicon.

14. The method of claim 11, the forming the tunneling barrier on top of the at least one memory cell further comprises forming a layer comprising the P-type metal on top of the gate silicon oxide.

15. The method of claim 11, further comprising:
creating at least one undercut region within the at least one memory cell;
growing at least one tunnel oxide layer in the at least one undercut region;
depositing a layer of silicon nitride over the at least one tunnel oxide layer;
forming sidewall spacers within the at least one memory cell; and
filling a remainder of the undercut region.

16. The method of claim 11, the creating of at least one charge storage element in at least one undercut region within the at least one memory cell further comprises selectively etching a gate silicon oxide layer of the at least one memory cell to create the at least one undercut region.

17. The method of claim 11, further comprising:
stripping at least one of a top layer or a top portion of an oxide layer, or combination thereof from the memory device;
at least one of:
regrowing the top portion of the oxide layer, or
depositing the high-K material to form a high-K layer, the high-K layer comprises at least part of the tunneling barrier formed on top of the at least one memory cell.

18. The method of claim 17, further comprising:
depositing a new top layer, the new top layer comprising one of the P+ polycrystalline silicon or the p-type metal, and comprises at least part of the tunneling barrier formed on top of the at least one memory cell.

19. A system that facilitates fabrication of a memory array in a memory, comprising:
a storage element formation component that forms at least one charge storage element in at least one undercut region of at least one memory cell stack, the at least one memory cell stack associated with the memory array in the memory; and
a tunneling barrier formation component that forms a tunneling barrier on top of the at least one memory cell stack, the tunneling barrier is at least one of a layer of a high work function material, comprising one of a P+ polycrystalline silicon or a P-type metal, or a layer of a high-K material, or a combination thereof, that optimally reduces a number of electrons tunneling from the tunneling barrier layer to the at least one charge storage element, which is in at least one memory cell of the memory array, during a Fowler-Nordheim (FN) erase operation to erase the at least one charge storage element, wherein each of the at least one charge storage element consists of a tunnel oxide layer formed over the substrate in the undercut region, a silicon rich nitride layer formed over the tunnel oxide layer and a layer of polysilicon.

20. The system of claim 19, further comprising:
an undercut formation component that forms at least two undercut regions in each of multiple stacks of silicon oxide;
a bit line formation component that forms bits lines between the stacks, each bit line is associated with a respective memory cell;
a spacer formation component that forms a sidewall spacer around each wall of each stack and fills in space between the stacks; and
a word line formation component that forms word lines for the memory array between the stacks, each word line is respectively associated with a memory cell.

21. The system of claim 19, the tunneling baffler formation component strips a gate electrode layer or a top portion of an oxide layer, or a combination thereof, from a top of each memory cell stack, and deposits a new gate electrode layer comprising the high work function material or the layer of high-K material, or a combination thereof, on top of each memory cell stack to form the tunneling barrier, wherein the stripped gate electrode layer comprises one of a P+ polycrystalline silicon, p-type metal, or N+-type polysilicon.

* * * * *